United States Patent
Kamibayashi et al.

(10) Patent No.: US 10,903,106 B2
(45) Date of Patent: Jan. 26, 2021

(54) LAYERED BODY OF TEMPORARY ADHESIVE

(71) Applicant: NISSAN CHEMICAL INDUSTRIES, LTD., Tokyo (JP)

(72) Inventors: Satoshi Kamibayashi, Toyama (JP);
Hiroshi Ogino, Toyama (JP);
Tomoyuki Enomoto, Toyama (JP);
Kazuhiro Sawada, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/313,632

(22) PCT Filed: Jun. 8, 2015

(86) PCT No.: PCT/JP2015/066494
§ 371 (c)(1),
(2) Date: Nov. 23, 2016

(87) PCT Pub. No.: WO2015/190438
PCT Pub. Date: Dec. 17, 2015

(65) Prior Publication Data
US 2017/0200628 A1    Jul. 13, 2017

(30) Foreign Application Priority Data

Jun. 10, 2014   (JP) ................. 2014-119394

(51) Int. Cl.
| | | |
|---|---|---|
| *H01L 21/683* | (2006.01) |
| *C09J 183/06* | (2006.01) |
| *B32B 7/06* | (2019.01) |
| *B32B 37/12* | (2006.01) |
| *B32B 7/12* | (2006.01) |
| *B32B 43/00* | (2006.01) |
| *C09J 183/04* | (2006.01) |
| *H01L 21/304* | (2006.01) |
| *H01L 21/02* | (2006.01) |
| *C09D 183/04* | (2006.01) |
| *B32B 38/10* | (2006.01) |
| *B32B 38/00* | (2006.01) |
| *C09J 5/00* | (2006.01) |
| *C08G 77/20* | (2006.01) |
| *C08G 77/12* | (2006.01) |

(52) U.S. Cl.
CPC ............ *H01L 21/6836* (2013.01); *B32B 7/06* (2013.01); *B32B 7/12* (2013.01); *B32B 37/12* (2013.01); *B32B 38/0008* (2013.01); *B32B 38/10* (2013.01); *B32B 43/006* (2013.01); *C09D 183/04* (2013.01); *C09J 5/00* (2013.01); *C09J 183/04* (2013.01); *C09J 183/06* (2013.01); *H01L 21/02* (2013.01); *H01L 21/304* (2013.01); *H01L 21/6835* (2013.01); *B32B 2250/02* (2013.01); *B32B 2383/00* (2013.01); *B32B 2457/14* (2013.01); *C08G 77/12* (2013.01); *C08G 77/20* (2013.01); *C09J 2203/00* (2013.01); *C09J 2301/502* (2020.08); *C09J 2483/00* (2013.01); *H01L 2221/6834* (2013.01); *H01L 2221/68327* (2013.01); *H01L 2221/68381* (2013.01); *H01L 2221/68386* (2013.01); *Y10S 156/93* (2013.01); *Y10T 156/11* (2015.01)

(58) Field of Classification Search
None
See application file for complete search history.

(56) References Cited

U.S. PATENT DOCUMENTS

| | | | | | |
|---|---|---|---|---|---|
| 4,785,047 | A | * | 11/1988 | Jensen .................. | C08K 13/02 524/262 |
| 5,157,086 | A | * | 10/1992 | Kanakura ............ | C08G 77/42 525/474 |
| 5,183,874 | A | * | 2/1993 | Veith .................... | C08G 69/42 525/474 |

(Continued)

FOREIGN PATENT DOCUMENTS

| | | |
|---|---|---|
| JP | 2008-532313 A | 8/2008 |
| JP | 2011-119427 A | 6/2011 |

(Continued)

OTHER PUBLICATIONS

Jan. 9, 2015 Written Opinion issued in Japanese Patent Application No. PCT/JP2015/066494.

(Continued)

*Primary Examiner* — Mark A Osele

(74) *Attorney, Agent, or Firm* — Oliff PLC

(57) ABSTRACT

A temporary adhesive is good peelability, heat resistance and cleaning removability after polishing of the rear surface of the wafer. A layered body for processing a rear surface of a wafer opposite to a circuit surface of the wafer, the layered body being a temporary adhesive loaded between a support and circuit surface of the wafer and including an adhesive layer (A) that includes a polyorganosiloxane to be cured by a hydrosilylation reaction and is releasably bonded, and a separation layer (B) includes a polyorganosiloxane and is releasably bonded, in which the polyorganosiloxane forming the separation layer (B) is a polyorganosiloxane containing a siloxane unit of $RRSiO_{2/2}$ (provided that each R is bonded to a silicon atom as a Si—C bond), and at least one R is an aralkyl group, epoxy group, or phenyl group. Methods for producing and separating these layered bodies and composition for forming the separation layer.

21 Claims, No Drawings

(56) References Cited

U.S. PATENT DOCUMENTS

| | | | | |
|---|---|---|---|---|
| 5,270,425 | A * | 12/1993 | Vanwert | C08L 83/04 524/730 |
| 5,629,136 | A * | 5/1997 | Higashi | G03F 7/0752 430/272.1 |
| 7,862,895 | B2 * | 1/2011 | Kamei | C09C 3/12 428/405 |
| 8,647,964 | B2 * | 2/2014 | Harkness | C09J 5/06 257/E21.122 |
| 9,334,435 | B2 * | 5/2016 | Koellnberger | C09J 183/04 |
| 10,106,713 | B2 * | 10/2018 | Tagami | B32B 27/283 |
| 2004/0043229 | A1 * | 3/2004 | Aoki | B32B 25/02 428/446 |
| 2006/0025517 | A1 * | 2/2006 | Guichard | B29C 33/64 524/588 |
| 2006/0198804 | A1 * | 9/2006 | Ono | A61Q 5/12 424/70.7 |
| 2007/0100072 | A1 * | 5/2007 | Akitomo | C08F 283/12 525/92 G |
| 2012/0187633 | A1 * | 7/2012 | Maliverney | C08L 83/04 277/316 |
| 2013/0108866 | A1 * | 5/2013 | Kato | C08G 77/52 428/354 |
| 2014/0106137 | A1 * | 4/2014 | Kondo | H01L 21/6835 428/195.1 |
| 2014/0154868 | A1 * | 6/2014 | Sugo | H01L 21/6835 438/458 |
| 2014/0243727 | A1 * | 8/2014 | Gibas | B41F 15/00 602/55 |

FOREIGN PATENT DOCUMENTS

| | | |
|---|---|---|
| JP | 2012-510715 A | 5/2012 |
| JP | 2012-513684 A | 6/2012 |
| JP | 2013-179135 A | 9/2013 |
| JP | 2013-232459 A | 11/2013 |

OTHER PUBLICATIONS

Aug. 1, 2015 Search Report issued in Japanese Patent Application No. PCT/JP2015/066494.

* cited by examiner

LAYERED BODY OF TEMPORARY ADHESIVE

TECHNICAL FIELD

The present invention relates to a temporary adhesive for fixing a wafer on a support during polishing of a rear surface of the wafer, and a layered body of the same.

BACKGROUND ART

For semiconductor wafers that are conventionally two-dimensionally integrated in a plane direction, a semiconductor integration technology of integrating (stacking) the plane wafers in a three-dimensional direction for the purpose of further integration has been required. The three-dimensional stacking is a technology in which wafers are integrated into a multilayer by connecting the wafers with a through silicon via (TSV). During integration into a multilayer, each wafer to be integrated is made thin by polishing a surface (i.e., rear surface) opposite to a surface on which a circuit is formed, and the thinned semiconductor wafers are layered.

Each semiconductor wafer before thinning (herein, simply referred to as wafer) is bonded to a support for polishing by a polisher. The bonding in this case is referred to as temporary bonding since the bonding needs to be easily peeled after polishing. This temporary bonding needs to be easily detached from the support. When a large force is applied for the detachment, the thinned semiconductor wafer may be broken or deformed. For a countermeasure against this, the temporary bonding is easily detached. However, it is not preferable that the temporary bonding be detached or shifted by polishing stress during polishing of the rear surface of the semiconductor wafer. Therefore, a performance required for the temporary bonding is resistance to stress during polishing and easy detachment after polishing.

For example, performances such as high stress in the plane direction during polishing (high bonding force) and low stress in a longitudinal direction during detachment (low bonding force) are required.

As a process of such bonding, a method in which an adhesive layer and a separation layer are used, and the separation layer is formed by plasma polymerization of dimethylsiloxane, and a wafer is mechanically separated after polishing (see Patent Documents 1 and 2), a method in which a supporting substrate and a semiconductor wafer are bonded using an adhesion composition, a rear surface of the semiconductor wafer is polished, and an adhesive is removed by an etching solution (see Patent Document 3), and a wafer processed body including a combination of a polymerized layer in which an alkenyl group-containing organopolysiloxane and a hydrosilyl group-containing organopolysiloxane are polymerized using a platinum catalyst as an adhesive layer for bonding a support to a semiconductor wafer with a polymerized layer including a thermosetting polysiloxane (see Patent Documents 4 and 5) are disclosed.

PRIOR ART DOCUMENTS

Patent Documents

Patent Document 1: Published Japanese Translation of PCT Application No. 2012-510715 (JP 2012-510715 A)
Patent Document 2: Published Japanese Translation of PCT Application No. 2012-513684 (JP 2012-513684 A)
Patent Document 3: Published Japanese Translation of PCT Application No. 2008-532313 (JP 2008-532313 A)
Patent Document 4: Japanese Patent Application Publication No. 2013-179135 (JP 2013-179135 A)
Patent Document 5: Japanese Patent Application Publication No. 2013-232459 (JP 2013-232459 A)

SUMMARY OF THE INVENTION

Problem to be Solved by the Invention

The present invention provides a layered body that is a temporary adhesive containing a temporary adhesive layer. The temporary adhesive layer is layered with a wafer on a support, and contains an adhesive layer including a polyorganosiloxane to be cured by a hydrosilylation reaction and a separation layer. The separation layer has excellent spin coating property on a circuit surface of the wafer during formation of the separation layer and excellent heat resistance during joining of the adhesive layer and processing of a rear surface of the wafer, and can be easily peeled after polishing of the rear surface of the wafer and can be easily removed by a solvent from the wafer to which the separation layer is attached after peeling.

Means for Solving the Problems

A first aspect of the present invention is a layered body for processing a rear surface of a wafer opposite to a circuit surface of the wafer, they layered body being a temporary adhesive loaded between a support and the circuit surface of the wafer and comprising an adhesive layer (A) that includes a polyorganosiloxane to be cured by a hydrosilylation reaction and is releasably bonded, and a separation layer (B) that includes a polyorganosiloxane and is releasably bonded, in which the polyorganosiloxane forming the separation layer (B) is a polyorganosiloxane containing a siloxane unit (D unit) of $RRSiO_{2/2}$ (provided that each R is bonded to a silicon atom as a Si—C bond), and at least one R is an aralkyl group, an epoxy group, or a phenyl group.

A second aspect is the layered body according to the first aspect, in which the adhesive layer (A) contains a polyorganosiloxane (a1) containing a polysiloxane selected from the group consisting of a siloxane unit (Q unit) of $SiO_2$, a siloxane unit (M unit) of $R^1R^2R^3SiO_{1/2}$, a siloxane unit (D unit) of $R^4R^5SiO_{2/2}$, and a siloxane unit (T unit) of $R^6SiO_{3/2}$ (provided that $R^1$ to $R^6$ are each bonded to a silicon atom as a Si—C bond) in which any two or more of $R^1$ to $R^6$ are $C_{1-10}$ alkyl groups or $C_{2-10}$ alkenyl groups, and a polyorganosiloxane (a2) containing the polysiloxane in which any two or more of $R^1$ to $R^6$ are $C_{1-10}$ alkyl groups or hydrogen atoms.

A third aspect is the layered body according to the first or second aspect, in which the separation layer (B) contains a polyorganosiloxane containing a siloxane unit (D unit) of $R^7R^8SiO_{2/2}$ (provided that $R^7$ and $R^8$ are each bonded to a silicon atom as a Si—C bond), and the polyorganosiloxane is a copolymer (b1) containing a unit structure in which $R^7$ and $R^8$ have a methyl group and a $C_{7-40}$ aralkyl group and a unit structure in which $R^7$ and $R^8$ have a methyl group and a $C_{1-10}$ alkyl group.

A fourth aspect is the layered body according to the first or second aspect, in which the separation layer (B) contains a polyorganosiloxane containing a siloxane unit (D unit) of $R^9R^{10}SiO_{2/2}$ (provided that $R^9$ and $R^{10}$ are each bonded to a silicon atom as a Si—C bond), and the polyorganosiloxane is a copolymer (b2) containing a unit structure in which $R^9$ and $R^{10}$ have a methyl group and an epoxycyclohexylalkyl group and a unit structure in which $R^9$ and $R^{10}$ are each a methyl group.

A fifth aspect is the layered body according to the first or second aspect, in which the separation layer (B) contains a polyorganosiloxane containing a siloxane unit (D unit) of $R^{11}R^{12}SiO_{2/2}$ (provided that $R^{11}$ and $R^{12}$ are each bonded to a silicon atom as a Si—C bond), and the polyorganosiloxane is a copolymer (b3) containing a unit structure in which $R^{11}$ and $R^{12}$ are each a phenyl group and a unit structure in which $R^{11}$ and $R^{12}$ are each a methyl group.

A sixth aspect is the layered body according to any one of the third to fifth aspects, in which the separation layer (B) is a mixture of the polyorganosiloxane (b1), the polyorganosiloxane (b2), or the polyorganosiloxane (b3), with a polydimethylsiloxane (b4).

A seventh aspect is the layered body according to any one of the first to sixth aspects as a layered body (S) comprising the adhesive layer (A) on the support and the separation layer (B) as a first separation layer (B1) on the circuit surface of the wafer.

An eight aspect is the layered body (S) according to the seventh aspect, further comprising the separation layer (B) as a second separation layer (B2) between the support and the adhesive layer (A).

A ninth aspect is the layered body according to any one of the first to sixth aspects as a layered body (T) comprising the adhesive layer (A) on the circuit surface of the wafer and the separation layer (B) as a first separation layer (B1) on the support.

A tenth aspect is a method for producing the layered body (S) according to the seventh aspect comprising forming the adhesive layer (A) on the support, forming the first separation layer (B1) on the circuit surface of the wafer by coating, and joining the support to the wafer so that the adhesive layer (A) and the first separation layer (B1) face each other.

An eleventh aspect is a method for producing the layered body (S) according to the eight aspect comprising forming the second separation layer (B2) on the support, forming the adhesive layer (A) on the layer, forming the first separation layer (B1) on the circuit surface of the wafer by coating, and joining the support to the wafer so that the adhesive layer (A) and the first separation layer (B1) face each other.

A twelfth aspect is a method for producing the layered body (S) according to the seventh aspect comprising forming the adhesive layer (A) on the support, forming the first separation layer (B1) on the layer, and layering the wafer on the first separation layer (B1) so that the first separation layer (B1) and the circuit surface face each other, followed by joining.

A thirteenth aspect is a method for producing the layered body (T) according to the ninth aspect comprising forming the first separation layer (B1) on the support, forming the adhesive layer (A) on the circuit surface of the wafer by coating, and joining the support to the wafer so that the adhesive layer (A) and the first separation layer (B1) face each other.

A fourteenth aspect is a method for producing the layered body (T) according to the ninth aspect comprising forming the first separation layer (B1) on the support, forming the adhesive layer (A) on the layer, and layering the wafer on the adhesive layer (A) so that the adhesive layer (A) and the circuit surface face each other, followed by joining.

A fifteenth aspect is a method for separating the layered body (S) according to the seventh aspect comprising, after the adhesive layer (A) is formed on the support, the first separation layer (B1) is formed on the circuit surface of the wafer by coating, and the support is jointed to the wafer so that the adhesive layer (A) and the first separation layer (B1) face each other, polishing the rear surface of the wafer opposite to the circuit surface of the wafer, and separating the support from the wafer in the first separation layer (B1).

A sixteenth aspect is a method for separating the layered body (S) according to the eight aspect comprising, after the second separation layer (B2) is formed on the support, the adhesive layer (A) is formed on the layer, the first separation layer (B1) is formed on the circuit surface of the wafer by coating, and the support is jointed to the wafer so that the adhesive layer (A) and the first separation layer (B1) face each other, polishing the rear surface of the wafer opposite to the circuit surface of the wafer, and separating the support from the wafer in the first separation layer (B1) and/or the second separation layer (B2).

A seventeenth aspect is a method for separating the layered body (S) according to the seventh aspect comprising, after the adhesive layer (A) is formed on the support, the first separation layer (B1) is formed on the layer, and the circuit surface of the wafer is layered on and jointed to the layer, polishing the rear surface of the wafer opposite to the circuit surface of the wafer, and separating the wafer from the support in the first separation layer (B1).

An eighteenth aspect is a method for separating the layered body (T) according to the ninth aspect comprising, after the first separation layer (B1) is formed on the support, the adhesive layer (A) is formed on the circuit surface of the wafer by coating, and the support is jointed to the wafer so that the adhesive layer (A) and the first separation layer (B1) face each other, polishing the rear surface of the wafer opposite to the circuit surface of the wafer, and separating the wafer from the support in the first separation layer (B1).

A nineteenth aspect is a method for separating the layered body (T) according to the ninth aspect comprising, after the first separation layer (B1) is formed on the support, the adhesive layer (A) is formed on the layer, and the circuit surface of the wafer is layered on and jointed to the layer, polishing the rear surface of the wafer opposite to the circuit surface of the wafer, and separating the wafer from the support in the first separation layer (B1).

A twenty aspect is a composition for forming the first separation layer (B1) or the second separation layer (B2) used in the layered body (S) or (T) according to any one of the first to ninth aspects.

Effects of the Invention

The present invention allows obtaining the following effects. That is the layered body for processing the rear surface of the wafer opposite to the circuit surface of the wafer, which is the temporary adhesive loaded between the support and the circuit surface of the wafer, and comprises the adhesive layer (A) that includes a polyorganosiloxane to be cured by a hydrosilylation reaction and is releasably bonded and a separation layer (B) that includes a polyorganosiloxane and is releasably bonded. Using the polyorganosiloxane having a specific structure for the separation layer (B) allows the separation layer to have excellent spin coating property on the circuit surface of the wafer and excellent heat resistance during joining of the adhesive layer and processing of the rear surface of the wafer, and allows the separation layer to be easily peeled after polishing of the rear surface of the wafer and to be easily removed by a solvent from the wafer to which the separation layer is attached after peeling.

In the processing of the side opposite to the circuit surface of the wafer, the wafer is made thin by polishing. A through silicon via (TSV) or the like is then formed, the thin wafer is peeled from the support, and a layered body of the wafer is formed. Thus, three-dimensional mounting is carried out. Before or after this time, an electrode or the like is also formed on the rear surface of the wafer. In thinning of the wafer and a TSV process, the wafer bonded to the support is heated at 250 to 350° C. However, the layered body as the temporary adhesive used in the present invention has heat resistance thereof.

MODES FOR CARRYING OUT THE INVENTION

The present invention is a layered body for processing a rear surface of a wafer opposite to a circuit surface of the wafer, which is a temporary adhesive loaded between a support and the circuit surface, comprising an adhesive layer (A) that includes a polyorganosiloxane to be cured by a hydrosilylation reaction and is releasably bonded, by a separation layer (B) that includes a polyorganosiloxane and is releasably bonded, in which the polyorganosiloxane forming the separation layer (B) is a polyorganosiloxane containing a siloxane unit (D unit) of $RRSiO_{2/2}$ (provided that each R is bonded to a silicon atom as a Si—C bond), and at least one R is an aralkyl group, an epoxy group, or a phenyl group.

In the present invention, the support and the wafer are temporarily bonded through the temporary adhesive layer, and the rear surface opposite to the circuit surface of the wafer is processed by polishing or the like. Thus, the thickness of the wafer can be made thin.

The temporary bonding is capable of bonding during polishing of the rear surface of the wafer, and separating the support from the thin wafer after polishing of the rear surface of the wafer.

In the present invention, the adhesive layer (A) forming the temporary adhesive layer is formed of an adhesive layer (A)-forming composition. The adhesive layer (A)-forming composition contains the following polysiloxane and an additive other than the polysiloxane.

It is preferable that in the adhesive layer (A), a polyorganosiloxane to be cured by a hydrosilylation reaction be used. For example, the adhesive layer (A) may contain a polyorganosiloxane (a1) containing a polysiloxane selected from the group consisting of a siloxane unit (Q unit) of $SiO_2$, a siloxane unit (M unit) of $R^1R^2R^3SiO_{1/2}$, a siloxane unit (D unit) of $R^4R^5SiO_{2/2}$, and a siloxane unit (T unit) of $R^6SiO_{3/2}$ (provided that $R^1$ to $R^6$ are each bonded to a silicon atom as a Si—C bond) in which any two or more of $R^1$ to $R^6$ are $C_{1-10}$ alkyl groups or $C_{2-10}$ alkenyl group, and a polyorganosiloxane (a2) containing the polysiloxane in which any two or more of $R^1$ to $R^6$ are $C_{1-10}$ alkyl groups or hydrogen atoms.

The polyorganosiloxane (a1) contains a $C_{1-10}$ alkyl group and a $C_{2-10}$ alkenyl group. The polyorganosiloxane (a2) contains a $C_{1-10}$ alkyl group and a hydrogen atom. An alkenyl group and a Si—H group form a crosslinking structure by a hydrosilylation reaction using a platinum catalyst, resulting in curing.

The polyorganosiloxane (a1) is selected from the Q unit, the M unit, the D unit, and T unit, and can be formed, for example, by a combination of (Q unit and M unit) and (D unit and M unit), a combination of (T unit and M unit) and (D unit and M unit), a combination of (Q unit, T unit, and M unit) and (T unit and M unit), a combination of (T unit and M unit), or a combination of (Q unit and M unit).

The polyorganosiloxane (a2) is selected from the Q unit, the M unit, the D unit, and T unit, and can be formed, for example, by a combination of (M unit and D unit), a combination of (Q unit and M unit), or a combination of (Q unit, T unit, and M unit).

Examples of the $C_{2-10}$ alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dipentenylmethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, and 1-i-propyl-2-propenyl group. In particular, ethenyl group, that is, vinyl group, or 2-propenyl group, that is, allyl group can be preferably used.

Examples of the $C_{1-10}$ alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group. In particular, methyl group can be preferably used.

The polyorganosiloxane (a1) contains the $C_{1-10}$ alkyl group and the $C_{2-10}$ alkenyl group, the $C_{1-10}$ alkyl group is a methyl group, and the $C_{2-10}$ alkenyl group is ethenyl group, that is, vinyl group. The content of the alkenyl group in all substituents of $R^1$ to $R^6$ may be 0.1% by mole to 50.0% by mole, and preferably 0.5% by mole to 30.0% by mole, and the rest of $R^1$ to $R^6$ may be alkyl group.

The polyorganosiloxane (a2) contains the $C_{1-10}$ alkyl group and a hydrogen atom, the $C_{1-10}$ alkyl group is methyl group, and the hydrogen atom forms a Si—H structure. The content of the hydrogen atom, that is, Si—H group in all the substituents of $R^1$ to $R^6$ may be 0.1% by mole to 50.0% by mole, and preferably 10.0% by mole to 40.0% by mole, and the rest of $R^1$ to $R^6$ may be alkyl group.

In the polyorganosiloxanes (a1) and (a2), the molar ratio of the alkenyl group to the hydrogen atom in the Si—H group may fall within a range of 2.0:1.0, and preferably 1.5:1.0.

The weight average molecular weights of the polyorganosiloxanes (a1) and (a2) to be used may fall within 500 to 1,000,000 and 5,000 to 50,000, respectively.

The adhesive layer (A) may further contain a platinum catalyst. A platinum-based metal catalyst is a catalyst for facilitating a hydrosilylation addition reaction of the alkenyl group with the Si—H group. The platinum-based metal catalyst such as platinum black, platinum chloride, chloroplatinic acid, a reactant of chloroplatinic acid with a monovalent alcohol, a complex of chloroplatinic acid with olefins, and platinum bisacetoacetate is used. Examples of the complex of platinum with olefins include a complex of divinyltetramethyldisiloxane with platinum. The amount of platinum catalyst to be added may fall within 1.0 to 50.0 ppm relative to the total amount of the polyorganosiloxanes (a1) and (a2).

In the adhesive layer (A), alkynyl alcohol can be further added as an inhibitor of inhibiting the advance of the hydrosilylation reaction. Examples of the inhibitor include 1-ethynyl-1-cyclohexanol. The inhibitor may be added in an amount falling within a range of 1,000.0 to 10,000.0 ppm relative to the polyorganosiloxanes (a1) and (a2).

The polyorganosiloxane used in the separation layer (B) of the present invention contains a siloxane unit (D unit) of $RRSiO_{2/2}$ (provided that each R is bonded to a silicon atom as a Si—C bond), and at least one R is an aralkyl group, an epoxy group, or a phenyl group. The separation layer (B) is formed of a separation layer (B)-forming composition. The separation layer (B)-forming composition may contain a polysiloxane and an addition component other than the polysiloxane.

The polysiloxane used in the separation layer (B) contains a siloxane unit (D unit), and may contain a Q unit, a M unit, and a T unit. Examples thereof include a polysiloxane containing only a D unit, a polysiloxane containing a combination of a D unit and a Q unit, a polysiloxane containing a combination of a D unit and a M unit, a polysiloxane containing a combination of a D unit and a T unit, a polysiloxane containing a combination of a D unit, a Q unit, and a M unit, a polysiloxane containing a combination of a D unit, a M unit, and a T unit, and a polysiloxane containing a combination of a D unit, a Q unit, a M unit, and a T unit.

The separation layer (B) contains a polyorganosiloxane containing a siloxane unit (D unit) of $R^7R^8SiO_{2/2}$ (provided that $R^7$ and $R^8$ are each bonded to a silicon atom as a Si—C bond), and as the polyorganosiloxane, a copolymer (b1) containing a unit structure in which $R^7$ and $R^8$ are a methyl group and a $C_{7-40}$ aralkyl group and a unit structure in which $R^7$ and $R^8$ are a methyl group and a $C_{1-10}$ alkyl group can be used.

As the $C_{1-10}$ alkyl group, the examples described above can be used. An aralkyl group is a substituent in which an alkyl group and an aryl group are combined, and has a structure in which the alkyl group is bonded to a silicon atom.

As the alkyl group, the examples described above can be used. Examples of the aryl group include phenyl group, naphthyl group, anthryl group, and biphenyl group. Preferable examples of the aralkyl group include benzyl group and phenethyl group. This alkyl group is bonded to the silicon atom and the aryl group as an alkylene group.

In the polyorganosiloxane (b1), a unit structure (b1-1) having a methyl group and a $C_{7-40}$ aralkyl group and a unit structure (b1-2) having a methyl group and a $C_{1-10}$ alkyl group can be used at a molar ratio of (b1-1):(b1-2) of 1:0.1 to 100.0, or 1:1.0 to 20.0.

The weight average molecular weight of the polyorganosiloxane (b1) to be used falls within a range of 500 to 100,000 or 5,000 to 30,000. For example, examples of the structure of Formula (b1) include as follows.

Formula (b1)

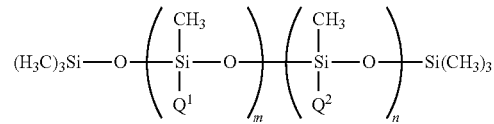

In Formula (b1), m and n are the number of repeating units, $Q^1$ is the aralkyl group, and $Q^2$ is the alkyl groups.

The separation layer (B) contains a polyorganosiloxane containing a siloxane unit (D unit) of $R^9R^{10}SiO_{2/2}$ (provided that $R^9$ and $R^{10}$ are each bonded to a silicon atom as a Si—C bond), and as the polyorganosiloxane, a copolymer (b2) containing a unit structure in which $R^9$ and $R^{10}$ are a methyl group and an epoxycyclohexylalkyl group and a unit structure in which $R^9$ and $R^{10}$ are each a methyl group can be used.

The epoxycyclohexylalkyl group is, for example, a substituent in which a 3,4-epoxycyclohexyl group and an alkyl group are combined, and has a structure in which the alkyl group is bonded to a silicon atom. Examples of the alkyl group include the alkyl groups described above, and for example, methyl group, ethyl group, and propyl group. This alkyl group is bonded to a silicon atom and an epoxycyclohexyl group as an alkylene group.

Examples of the epoxycyclohexylalkyl group include 3,4-epoxycyclohexyl methyl group, 3,4-epoxycyclohexylalkyl group, and 3,4-epoxycyclohexylpropyl group.

In the polyorganosiloxane (b2), a unit structure (b2-1) having a methyl group and an epoxycyclohexylalkyl group and a unit structure (b2-2) having each methyl group can be used at a molar ratio of (b2-1):(b2-2) of 1:0.1 to 100.0, or 1:10.0 to 100.0.

The weight average molecular weight of the polyorganosiloxane (b2) to be used falls within a range of 5,000 to 100,000 or 10,000 to 80,000. For example, examples of the structure of Formula (b2) include as follows.

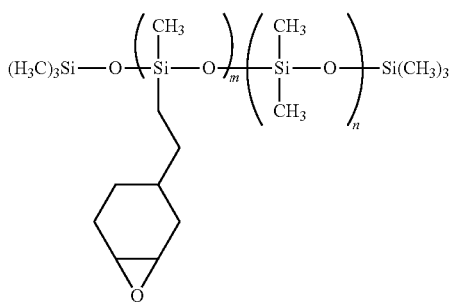

Formula (b2)

In Formula (b2), m and n are the number of repeating units.

The separation layer (B) contains a polyorganosiloxane containing a siloxane unit (D unit) of $R^{11}R^{12}SiO_{2/2}$ (provided that $R^{11}$ and $R^{12}$ are each bonded to a silicon atom as a Si—C bond), and as the polyorganosiloxane, a copolymer (b3) containing a unit structure in which $R^{11}$ and $R^{12}$ are each a phenyl group and a unit structure in which $R^{11}$ and $R^{12}$ are each a methyl group can be used. The polyorganosiloxane may have an alkenyl group such as a vinyl group and an allyl group at an end of the molecular chain. This alkenyl group is bonded to a silicon atom.

The polyorganosiloxane has a diphenyl silicon structure in which a phenyl group is directly bonded to a silicon atom.

A unit structure (b3-1) having a phenyl group and a unit structure (b3-2) having a methyl group can be used at a molar ratio of 1:0.1 to 100.0, or 1:1.0 to 50.0.

The weight average molecular weight of the polyorganosiloxane (b3) to be used falls within a range of 5,000 to 50,000 or 10,000 to 100,000. For example, examples of the structure of Formula (b3) include as follows.

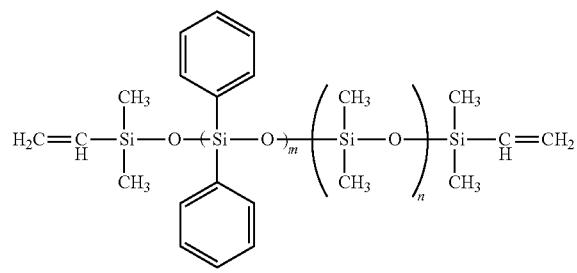

Formula (b3)

In Formula (b3), m and n are the number of repeating units. The content of diphenylsiloxane may be 15 to 17% by mole.

In the separation layer (B), a mixture of the polyorganosiloxane (b1), (b2), or (b3), with a polydimethylsiloxane (b4) can be used. The polyorganosiloxane (b1), (b2), or (b3), and the polydimethylsiloxane (b4) can be used at a mass ratio of 1:0.1 to 10 or 1:0.5 to 7.

In the separation layer (B), the polyorganosiloxane (b1), (b2), or (b3) can be used alone. The polyorganosiloxane (b1), (b2), or (b3) is respectively mixed with the polydimethylsiloxane (b4), and the mixture can be used as a mixture of polysiloxane.

When the polyorganosiloxane (b1), (b2), or (b3) is used alone, or the mixture thereof with the polydimethylsiloxane (b4) is used, the polyorganosiloxanes (b1), (b2), and (b3), and the polydimethylsiloxane (b4) can be each dissolved in hexamethyldisiloxane (b5) at a concentration of 1 to 100% by mass or 5 to 20% by mass, and typically 10% by mass.

The separation layer-forming composition can be obtained as a polyorganosiloxane solution for forming the separation layer (B) as follows. For example, the polyorganosiloxane (b1), (b2), or (b3) is dissolved in the hexamethyldisiloxane (b5) at the above-described concentration, and the polydimethylsiloxane (b4) is separately dissolved in the hexamethyldisiloxane (b5) at the above-described concentration. Both the polyorganosiloxane solutions are mixed at a ratio of 1:0.1 to 10.0 or 1:0.5 to 7, and typically 1:1.

As the polydimethylsiloxane (b4), a polymer having a polymerization degree of 200 to 1,000 can be used.

The layered body of the present invention is a layered body (S) containing the adhesive layer (A) on the support and the separation layer (B) as a first separation layer (B1) on the circuit surface of the wafer.

The layered body (S) of the present invention can be produced by forming the adhesive layer (A) on the support, forming the first separation layer (B1) on the circuit surface of the wafer by coating, and joining the support to the wafer so that the adhesive layer (A) and the first separation layer (B1) face each other.

The adhesive layer (A) can be formed by applying the composition for forming a polysiloxane of the adhesive layer (A) containing the polyorganosiloxanes (a1) and (a2) at room temperature.

The separation layer (B) such as the first and second separation layers can be formed by applying the composition for forming polysiloxane containing the copolymer (b1), the composition for forming polysiloxane containing the copolymer (b2), or the composition for forming polysiloxane containing the copolymer (b3), followed by heating at 100° C. to 200° C.

It is preferable that a step of joining the support to the wafer so that the adhesive layer (A) and the first separation layer (B1) face each other be carried out under reduced pressure, and after joining, the layered body be heated at 120 to 230° C.

Thus, the layered body (S) further containing the separation layer (B) as the second separation layer (B2) between the support and the adhesive layer (A) can be obtained.

The layered body (S) can be produced by forming the second separation layer (B2) on the support, forming the adhesive layer (A) on the layer, forming the first separation layer (B1) on the circuit surface of the wafer by coating, and joining the support to the wafer so that the adhesive layer (A) and the first separation layer (B1) face each other.

Furthermore, the layered body (S) can be produced by forming the adhesive layer (A) on the support, forming the first separation layer (B1) on the layer, and layering the wafer on the first separation layer (B1) so that the first separation layer (B1) and the circuit surface face each other, followed by joining.

The layered body of the present invention is a layered body (T) containing the adhesive layer (A) on the circuit surface of the wafer and the separation layer (B) as the first separation layer (B1) on the support.

The layered body (T) can be produced by forming the first separation layer (B1) on the support, forming the adhesive layer (A) on the circuit surface of the wafer by coating, and joining the support to the wafer so that the adhesive layer (A) and the first separation layer (B1) face each other.

The layered body (T) can be produced by forming the first separation layer (B1) on the support, forming the adhesive layer (A) on the layer, and layering the wafer on the adhesive layer (A) so that the adhesive layer (A) and the circuit surface face each other, followed by joining.

In the formation of the adhesive layer (A), the polyorganosiloxane for forming the adhesive layer (A) is attached to the support, for example, by a spin coater. Thus, the adhesive layer (A) can be formed.

In the formation of the separation layer (B), the polyorganosiloxane for forming the separation layer (B) is attached to the circuit surface of the wafer, for example, by a spin coater, and heated at a temperature of 100 to 200° C. Thus, the separation layer (B) can be formed.

The support having the adhesive layer (A) and the wafer having the first separation layer (B1) are jointed under reduced pressure (e.g., a reduced pressure of 10 Pa to 10,000 Pa). Thus, the layered body can be formed. Both the support and the wafer may be joined by heating (e.g., at 120° C. to 230° C.) under reduced pressure. By this heating, the adhesive layer (A) is cured.

The layered body of the present invention can be formed by forming the second separation layer (B2) between the support and the adhesive layer (A) by coating. In this case, before the adhesive layer (A) is formed on the support, the second separation layer (B2) may be applied.

The support having the second separation layer (B2) and the adhesive layer (A), and the wafer having the first separation layer (B1) are jointed under reduced pressure (e.g., a reduced pressure of 10 Pa to 10,000 Pa). Thus, the layered body can be formed. Both the support and the wafer may be joined by heating (e.g., at 120° C. to 230° C.) under reduced pressure. By this heating, the adhesive layer (A) is cured.

The wafer and the support having the first separation layer (B1) and the adhesive layer (A) are jointed under reduced pressure (e.g., a reduced pressure of 10 Pa to 10,000 Pa). Thus, the layered body can be formed. Both the support and the wafer may be joined by heating (e.g., at 120° C. to 230° C.) under reduced pressure. By this heating, the adhesive layer (A) is cured.

The support having the first separation layer (B1) and the wafer having the adhesive layer (A) are jointed under reduced pressure (e.g., a reduced pressure of 10 Pa to 10,000 Pa). Thus, the layered body can be formed. Both the support and the wafer may be joined by heating (e.g., at 120° C. to 230° C.) under reduced pressure. By this heating, the adhesive layer (A) is cured.

In the second separation layer (B2), the same components as those in the first separation layer (B1) can be used at the same mixing ratio.

In processing of the side opposite to the circuit surface of the wafer, the wafer is made thin by polishing. A through silicon via (TSV) or the like is then formed, the thin wafer is peeled from the support, and a layered body of the wafer is formed. Thus, three-dimensional mounting is carried out. Before or after this time, an electrode or the like is also formed on the rear surface of the wafer. In thinning of the wafer and a TSV process, the wafer bonded to the support is heated at 250 to 350° C. However, the layered body as the temporary adhesive used in the present invention has heat resistance thereof.

After the support and the wafer are bonded and the rear surface was processed (polished), the support and the wafer can be separated.

In a method for separating the layered body (S), after the adhesive layer (A) is formed on the support, the first separation layer (B1) is formed on the circuit surface of the wafer by coating, and the support is jointed to the wafer so that the adhesive layer (A) and the first separation layer (B1) face each other, the rear surface of the wafer opposite to the circuit surface of the wafer is polished, and the support is separated from the wafer in the first separation layer (B1).

In the method for separating the layered body (S), after the second separation layer (B2) is formed on the support, the adhesive layer (A) is formed on the layer, the first separation layer (B1) is formed on the circuit surface of the wafer by coating, and the support is jointed to the wafer so that the adhesive layer (A) and the first separation layer (B1) face each other, the rear surface of the wafer opposite to the circuit surface of the wafer is polished, and the support is separated from the wafer in the first separation layer (B1) and/or the second separation layer (B2).

In a method for separating the layered body (T), after the first separation layer (B1) is formed on the support, the adhesive layer (A) is formed on the circuit surface of the wafer by coating, and the support is jointed to the wafer so that the adhesive layer (A) and the first separation layer (B1) face each other, the rear surface of the wafer opposite to the circuit surface of the wafer is polished, and the support is separated from the wafer in the first separation layer (B1).

In the method for separating the layered body (T), after the first separation layer (B1) is formed on the support, the adhesive layer (A) is formed on the layer, and the circuit surface of the wafer is layered on and jointed to the layer, the rear surface of the wafer opposite to the circuit surface of the wafer is polished, and the wafer is separated from the support in the first separation layer (B1).

Examples of a peeling method include solvent peeling, laser peeling, mechanical peeling using a machine having a sharp part, and peeling by pulling the support and the wafer.

The present invention is also a separation layer-forming composition for forming the first separation layer (B1) or the second separation layer (B2) used in the layered body.

The separation layer-forming composition contains a polyorganosiloxane containing a siloxane unit (D unit) of $R^7R^8SiO_{2/2}$ (provided that $R^7$ and $R^8$ are each bonded to a silicon atom as a Si—C bond), and the polyorganosiloxane is the copolymer (b1) containing a unit structure in which $R^7$ and $R^8$ are a methyl group and a $C_{7-40}$ aralkyl group and a unit structure in which $R^7$ and $R^8$ are a methyl group and a $C_{1-10}$ alkyl group.

Another separation layer-forming composition contains a polyorganosiloxane containing a siloxane unit (D unit) of $R^9R^{10}SiO_{2/2}$ (provided that $R^9$ and $R^{10}$ are each bonded to a silicon atom as a Si—C bond), and the polyorganosiloxane is the copolymer (b2) containing a unit structure in which $R^9$ and $R^{10}$ are a methyl group and an epoxycyclohexylalkyl group and a unit structure in which $R^9$ and $R^{10}$ are each a methyl group.

Yet another separation layer-forming composition contains a polyorganosiloxane containing a siloxane unit (D unit) of $R^{11}R^{12}SiO_{2/2}$ (provided that $R^{11}$ and $R^{12}$ are each bonded to a silicon atom as a Si—C bond), and the polyorganosiloxane is the copolymer (b3) containing a unit structure in which $R^{11}$ and $R^{12}$ are each a phenyl group and a unit structure in which $R^{11}$ and $R^{12}$ are each a methyl group.

A mixture of the polyorganosiloxane (b1), (b2), or (b3) with the polydimethylsiloxane (b4) may be used. Each mixture may be dissolved in hexamethyldisiloxane and then used.

EXAMPLES (Separation Layer-Forming Composition 1)

A polyorganosiloxane corresponding to (b1) (trade name XF42-334, available from Momentive Performance Materials Inc.) and a polyorganosiloxane corresponding to (b4) (trade name AK1000000, available from Wacker Chemie AG) were each dissolved in hexamethyldisiloxane corresponding to (b5) at a concentration of 10% by mass. Both the solutions were mixed at a mass ratio of 1:1, to form a separation layer-forming composition (1).

(Separation Layer-Forming Composition 2)

A polyorganosiloxane corresponding to (b2) (trade name ECMS-327, available from Gelest, Inc.) and a polyorganosiloxane corresponding to (b4) (trade name AK1000000, available from Wacker Chemie AG) were each separately dissolved in hexamethyldisiloxane corresponding to (b5) at a concentration of 10% by mass. Both the solutions were mixed at a mass ratio of 1:1, to form a separation layer-forming composition (2).

(Separation Layer-Forming Composition 3)

A polyorganosiloxane corresponding to (b3) (trade name PDV-1641, available from Gelest, Inc.) and a polyorganosiloxane corresponding to (b4) (trade name AK1000000, available from Wacker Chemie AG) were each separately dissolved in hexamethyldisiloxane corresponding to (b5) at a concentration of 10% by mass. Both the solutions were mixed at a mass ratio of 1:1, to form a separation layer-forming composition (3).

(Separation Layer-Forming Composition 4)

A polyorganosiloxane corresponding to (c1) (trade name KF-412, available from Shin-Etsu Chemical Co., Ltd., component: long chain alkyl group-containing polyorganosiloxane) and a polyorganosiloxane corresponding to (b4) (trade name AK1000000, available from Wacker Chemie AG) were each separately dissolved in hexamethyldisiloxane corresponding to (b5) at a concentration of 10% by mass. Both the solutions were mixed at a mass ratio of 1:1, to form a separation layer-forming composition (4).

Formula (c1)

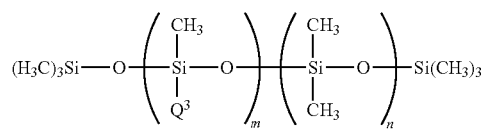

In Formula (c1), $Q^3$ is a long chain alkyl group.

(Separation Layer-Forming Composition 5)

A polyorganosiloxane corresponding to (c2) (trade name KF-412, available from Shin-Etsu Chemical Co., Ltd., component: polyether group-containing polyorganosiloxane) and a polyorganosiloxane corresponding to (b4) (trade name AK1000000, available from Wacker Chemie AG) were each separately dissolved in hexamethyldisiloxane corresponding to (b5) at a concentration of 10% by mass. Both the solutions were mixed at a mass ratio of 1:1, to form a separation layer-forming composition (5).

Formula (c2)

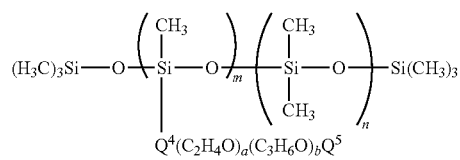

In Formula (c2), $Q^4$ is an alkylene group, $Q^5$ is an alkyl group, and a and b are a repeating unit.

Example 1

For formation of a first separation layer (B1), a film with a thickness of about 2 μm was formed from each of the separation layer-forming compositions (1) to (5) on a silicon wafer of 300 mm (thickness: 770 μm) by spin coating, and heated and baked at 100° C. for 1 minute and at 160° C. for 1 minute, to form each of separation layers (1) to (5). For formation of an adhesive layer (A), a polysiloxane resin (available from Wacker Chemie AG) was applied to the film by spin coating so that the thickness was about 110 μm. The silicon wafer having this resin layer and a support layer of glass wafer of 300 mm (thickness: 700 μm) were bonded in a vacuum bonder (LF bonder, manufactured by SUSS MicroTec KK) such that the resin was put between the silicon wafer and the support layer. Thus, a layered body was produced. The layered body was then heated on a hot plate at 140° C. for 15 minutes and at 190° C. for 10 minutes. Thereafter, the following tests were carried out. The results are shown in Table 1.

Example 2

For formation of a first separation layer (B1), a film with a thickness of about 2 μm was formed from each of the separation layer-forming compositions (1) to (5) by spin coating on a wafer bump-forming surface of a silicon wafer of 300 mm (thickness: 700 μm) on a surface of which tin-copper bumps with a height of 80 μm and a diameter of 105 μm were formed between scribe lines with a width of 110 μm in an area of 15 mm² at a pitch of 200 μm, and heated and baked at 100° C. for 1 minute and at 160° C. for 1 minute, to form each of separation layers (1) to (5). For formation of an adhesive layer (A), a polysiloxane resin (available from Wacker Chemie AG) was applied to the film by spin coating such that the thickness was about 110 μm. The silicon wafer having this resin layer and a support layer of glass wafer of 300 mm (thickness: 700 μm) were bonded in a vacuum bonder so that the resin was put between the silicon wafer and the support layer. Thus, a layered body was produced. The layered body was then heated on a hot plate at 140° C. for 15 minutes and at 190° C. for 10 minutes. Thereafter, the following tests were conducted. The results are shown in Table 2.

Example 3

For formation of a first separation layer (B1), a film with a thickness of about 2 was formed from each of the separation layer-forming compositions (1) to (5) on a support layer of a glass wafer of 300 mm (thickness: 700 μm) by spin coating, and heated and baked at 100° C. for 1 minute and at 160° C. for 1 minute, to form each of separation layers (1) to (5). For formation of an adhesive layer (A), a polysiloxane resin (available from Wacker Chemie AG) was applied to a silicon wafer of 300 mm (thickness: 770 μm) by spin coating such that the thickness was about 110 μm. The support layer of the glass wafer having the separation layer and the silicon wafer having the resin layer were bonded in a vacuum bonder (manual bonder, manufactured by SUSS MicroTec KK) so that the separation layer faces the resin layer. Thus, a layered body was produced. The layered body was then heated on a hot plate at 150° C. for 15 minutes and at 190° C. for 10 minutes. Thereafter, the following tests were conducted. The results are shown in Table 3.

(Heat Resistance Test)

The layered body resulting from heating the bonded wafer on a hot plate was placed in an oven under an atmosphere at 150° C. for 3 hours, at 180° C. for 2 hours, and at 260° C. for 10 minutes, and the presence or absence of anomalies of appearance was checked. The layered body was evaluated as good and reported as "○" when no anomalies in appearance were found, and evaluated as poor and reported as "X" when anomalies were found.

(Peeling Test)

After the heat resistance test, the layered body was disposed on a suction stage so that the silicon wafer side of the layered body was vacuum sucked. At room temperature, a wedge was put between the silicon wafer and the glass wafer, and a part thereof was peeled. The glass wafer side of the layered boy was attached to a suction disk by vacuum sucking, and the suction disk was raised to peel the glass substrate. The layered body was reported as "○" when the glass wafer was peeled without crack of the wafer, and evaluated as poor and reported as "X" when anomalies such as crack occurred.

(Cleaning Removability Test)

After the peeling test, the peeled silicon wafer was set on a spin coater with the first separation layer (B1) facing upward, immersed in an organic solvent containing tetra-butylammonium fluoride (TBAF) as a cleaning solvent for 5 minutes, and spun to drain the solution. The wafer was rinsed by spraying i-propyl alcohol (IPA) while the wafer is spun. The appearance was observed, and the presence or absence of the first separation layer (B1) remained was visually checked. The wafer was evaluated as good and reported as "○" when no remained resin was found, and evaluated as poor and reported as "X" when the remained resin was found.

TABLE 1

(Results of Example 1)

| | Separation layer (1) | Separation layer (2) | Separation layer (3) | Separation layer (4) | Separation layer (5) |
|---|---|---|---|---|---|
| Heat resistance | ○ | ○ | ○ | ○ | ○ |
| Peelability | ○ | ○ | ○ | X | X |
| Cleaning removability | ○ | ○ | ○ | X | X |

TABLE 2

(Results of Example 2)

| | Separation layer (1) | Separation layer (2) | Separation layer (3) | Separation layer (4) | Separation layer (5) |
|---|---|---|---|---|---|
| Heat resistance | ○ | ○ | ○ | ○ | ○ |
| Peelability | ○ | ○ | ○ | X | X |
| Cleaning removability | ○ | ○ | ○ | X | X |

TABLE 3

(Results of Example 3)

| | Separation layer (1) | Separation layer (2) | Separation layer (3) | Separation layer (4) | Separation layer (5) |
|---|---|---|---|---|---|
| Heat resistance | ○ | ○ | ○ | ○ | ○ |
| Peelability | ○ | ○ | ○ | X | X |

In the results of Tables 1 and 2 relating to the layered body (S), the separation layers (1) to (3) formed from the separation layer-forming compositions 1 to 3, respectively, show good heat resistance, peelability, and cleaning removability.

On the other hand, the separation layers (4) and (5) formed from the separation layer-forming compositions 4 and 5, respectively, do not show good peelability and cleaning removability.

In the results of Table 3 relating to the layered body (T), the separation layers (1) to (3) formed from the separation layer-forming compositions 1 to 3, respectively, show good heat resistance and peelability. The separation layers (4) and (5) formed from the separation layer-forming compositions 4 and 5, respectively, do not show good peelability.

INDUSTRIAL APPLICABILITY

A temporary adhesive layer is layered with a wafer on a support, and contains an adhesive layer including a polyorganosiloxane to be cured by a hydrosilylation reaction and a separation layer. The separation layer has excellent spin coating property on a circuit surface of the wafer during formation of the separation layer and excellent heat resistance during joining of the adhesive layer and processing of a rear surface of the wafer, and can be easily peeled after polishing of the rear surface of the wafer and can be simply removed by a solvent from the wafer to which the separation layer is attached after peeling.

The invention claimed is:

1. A layered body for processing a rear surface of a wafer opposite to a circuit surface of the wafer, the layered body being a temporary adhesive loaded between a support and the circuit surface of the wafer and comprising an adhesive layer (A) that includes a polyorganosiloxane to be cured by a hydrosilylation reaction and is releasably bonded and a separation layer (B) that includes a polyorganosiloxane and is releasably bonded, wherein the adhesive layer (A) contains a polyorganosiloxane (a1) containing a polysiloxane having at least one unit selected from the group consisting of a siloxane unit (Q unit) of $SiO_2$, a siloxane unit (M unit) of $R^1R^2R^3SiO_{1/2}$, a siloxane unit (D unit) of $R^4R^5SiO_{2/2}$, and a siloxane unit (T unit) of $R^6SiO_{3/2}$ provided that $R^1$ to $R^6$ are each bonded to a silicon atom as a Si—C bond except that when any of $R^1$ to $R^6$ are hydrogen, the bond is a Si—H bond in which any one or more of $R^1$ to $R^6$ is a $C_{1-10}$ alkyl group and any one or more of $R^1$ to $R^6$ is a $C_{2-10}$ alkenyl group, and a polyorganosiloxane (a2) containing the polysiloxane in which any one or more of $R^1$ to $R^6$ is a $C_{1-10}$ alkyl groups and any one or more of $R^1$ to $R^6$ is a hydrogen atom, and the separation layer (B) contains a polyorganosiloxane containing a siloxane unit (D unit) of $R^7R^8SiO_{2/2}$ provided that $R^7$ and $R^8$ are each bonded to a silicon atom as a Si—C bond, and the polyorganosiloxane is a copolymer (b1) containing repeating units in which $R^7$ and $R^8$ are a methyl group and a $C_{7-40}$ aralkyl group, respectively, and repeating units in which $R^7$ and $R^8$ are a methyl group and a $C_{1-10}$ alkyl group, respectively.

2. The layered body according to claim 1, wherein the separation layer (B) additionally contains a polyorganosiloxane containing a siloxane unit (D unit) of $R^9R^{10}SiO_{2/2}$ provided that $R^9$ and $R^{10}$ are each bonded to a silicon atom as a Si—C bond, and the polyorganosiloxane is a copolymer (b2) containing repeating units in which $R^9$ and $R^{10}$ are a methyl group and an epoxycyclohexylalkyl group, respectively, and repeating units in which $R^9$ and $R^{10}$ are each a methyl group.

3. The layered body according to claim 1, wherein the separation layer (B) additionally contains a polyorganosiloxane containing a siloxane unit (D unit) of $R^{11}R^{12}SiO_{2/2}$ provided that $R^{11}$ and $R^{12}$ are each bonded to a silicon atom as a Si—C bond, and the polyorganosiloxane is a copolymer (b3) containing repeating units in which $R^{11}$ and $R^{12}$ are each a phenyl group and repeating units in which $R^{11}$ and $R^{12}$ are each a methyl group.

4. The layered body according to claim 1, wherein the separation layer (B) additionally contains a polydimethylsiloxane (b4).

5. The layered body according to claim 1, which is a layered body (S) comprising the adhesive layer (A) on the support and the separation layer (B) as a first separation layer (B1) on the circuit surface of the wafer.

6. The layered body (S) according to claim 5, further comprising the separation layer (B) as a second separation layer (B2) between the support and the adhesive layer (A).

7. A method for producing the layered body (S) according to claim 6 comprising forming the second separation layer (B2) on the support, forming the adhesive layer (A) on the layer, forming the first separation layer (B1) on the circuit surface of the wafer by coating, and joining the support to the wafer so that the adhesive layer (A) and the first separation layer (B1) face each other.

8. A method for separating the layered body (S) according to claim 6 comprising, after the second separation layer (B2) is formed on the support, the adhesive layer (A) is formed on the layer, the first separation layer (B1) is formed on the circuit surface of the wafer by coating, and the support is jointed to the wafer so that the adhesive layer (A) and the first separation layer (B1) face each other, polishing the rear surface of the wafer opposite to the circuit surface of the wafer, and separating the support from the wafer in the first separation layer (B1) and/or the second separation layer (B2).

9. A method for producing the layered body (S) according to claim 5 comprising forming the adhesive layer (A) on the support, forming the first separation layer (B1) on the circuit surface of the wafer by coating, and joining the support to the wafer so that the adhesive layer (A) and the first separation layer (B1) face each other.

10. A method for producing the layered body (S) according to claim 5 comprising forming the adhesive layer (A) on the support, forming the first separation layer (B1) on the layer, and layering the wafer on the first separation layer (B1) so that the first separation layer (B1) and the circuit surface face each other, followed by joining.

11. A method for separating the layered body (S) according to claim 5 comprising, after the adhesive layer (A) is formed on the support, the first separation layer (B1) is formed on the circuit surface of the wafer by coating, and the support is jointed to the wafer so that the adhesive layer (A) and the first separation layer (B1) face each other, polishing the rear surface of the wafer opposite to the circuit surface of the wafer, and separating the support from the wafer in the first separation layer (B1).

12. A method for separating the layered body (S) according to claim 5 comprising, after the adhesive layer (A) is formed on the support, the first separation layer (B1) is formed on the layer, and the circuit surface of the wafer is layered on and jointed to the layer, polishing the rear surface of the wafer opposite to the circuit surface of the wafer, and separating the support from the wafer in the first separation layer (B1).

13. The layered body according to claim 1, which is a layered body (T) comprising the adhesive layer (A) on the circuit surface of the wafer and the separation layer (B) as a first separation layer (B1) on the support.

14. A method for producing the layered body (T) according to claim 13 comprising forming the first separation layer (B1) on the support, forming the adhesive layer (A) on the circuit surface of the wafer by coating, and joining the support to the wafer so that the adhesive layer (A) and the first separation layer (B1) face each other.

15. A method for producing the layered body (T) according to claim 13 comprising forming the first separation layer (B1) on the support, forming the adhesive layer (A) on the layer, and layering the wafer on the adhesive layer (A) so that the adhesive layer (A) and the circuit surface face each other, followed by joining.

16. A method for separating the layered body (T) according to claim 13 comprising, after the first separation layer (B1) is formed on the support, the adhesive layer (A) is formed on the circuit surface of the wafer by coating, and the support is jointed to the wafer so that the adhesive layer (A) and the first separation layer (B1) face each other, polishing the rear surface of the wafer opposite to the circuit surface of the wafer, and separating the wafer from the support in the first separation layer (B1).

17. A method for separating the layered body (T) according to claim 13 comprising, after the first separation layer (B1) is formed on the support, the adhesive layer (A) is formed on the layer, and the circuit surface of the wafer is layered on and jointed to the layer, polishing the rear surface of the wafer opposite to the circuit surface of the wafer, and separating the wafer from the support in the first separation layer (B1).

18. The layered body according to claim 1, wherein
in the polyorganosiloxane (a1), the $C_{1-10}$ alkyl group is a methyl group, and the $C_{2-10}$ alkenyl group is an ethenyl group, and
in the polyorganosiloxane (a2), the $C_{1-10}$ alkyl group is a methyl group, and the hydrogen atom forms a Si—H structure.

19. The layered body according to claim 1, wherein a content of the alkenyl group in all substituents of $R^1$ to $R^6$ is 0.1% by mole to 50.0% by mole, a content of the hydrogen atom forming a Si—H group in all the substituents of $R^1$ to $R^6$ is be 0.1% by mole to 50.0% by mole, and a remainder of $R^1$ to $R^6$ is an alkyl group.

20. The layered body according to claim 1, wherein in the polyorganosiloxanes (a1) and (a2), a molar ratio of the alkenyl group to the hydrogen atom forming a Si—H group is within a range of 2.0:1.0 to 1.0:1.0.

21. A composition comprising a polyorganosiloxane containing a siloxane unit (D unit) of $R^7R^8SiO_{2/2}$ provided that $R^7$ and $R^8$ are each bonded to a silicon atom as a Si—C bond, and the polyorganosiloxane is a copolymer (b1) containing repeating units in which $R^7$ and $R^8$ are a methyl group and a $C_{7-40}$ aralkyl group, respectively, and repeating units in which $R^7$ and $R^8$ are a methyl group and a $C_{1-10}$ alkyl group, respectively.

* * * * *